United States Patent [19]

Ono

[11] Patent Number: 4,779,562
[45] Date of Patent: Oct. 25, 1988

[54] APPARATUS FOR DEPOSITING MONO-MOLECULAR LAYER

[75] Inventor: Yoshinobu Ono, Tokyo, Japan

[73] Assignee: Fujitsu Limited, Kanagawa, Japan

[21] Appl. No.: 25,253

[22] Filed: Mar. 12, 1987

[30] Foreign Application Priority Data

Mar. 19, 1986 [JP] Japan .................................. 61-61274
Apr. 18, 1986 [JP] Japan .................................. 61-90348
Jun. 18, 1986 [JP] Japan .................................. 61-142539

[51] Int. Cl.$^4$ .......................... B05C 3/109; B05C 3/18
[52] U.S. Cl. .................................. 118/402; 118/421; 427/434.3
[58] Field of Search ............... 427/434.3; 118/402, 118/403, 421

[56] References Cited

U.S. PATENT DOCUMENTS

| | | | |
|---|---|---|---|
| 618,672 | 1/1899 | Henry | 118/421 X |
| 2,255,436 | 9/1941 | Olson | 118/421 X |
| 3,557,749 | 1/1971 | Farago | 118/421 X |
| 4,204,498 | 5/1980 | Ivancic | 118/421 X |
| 4,646,678 | 3/1987 | Grunfeld | 118/402 X |

FOREIGN PATENT DOCUMENTS

0119126 9/1984 European Pat. Off. .
0169031 1/1986 European Pat. Off. .
405761 2/1934 United Kingdom ............... 118/402

Primary Examiner—John McIntosh
Attorney, Agent, or Firm—Armstrong, Nikaido, Marmelstein & Kubovcik

[57] ABSTRACT

An apparatus for depositing a mono-molecular layer on a substrate surface comprises first and second containers which contain a liquid and are connected via a connecting passage, and a pressure applying mechanism for applying pressure on the liquid in the second container. A mono-molecular layer is formed at the liquid surface of the liquid in the first container, and the mono-molecular layer is deposited on the substrate surface by controlling the pressure applying mechanism so that the liquid surface of the first container rises and falls with respect to the substrate which is essentially stationary.

10 Claims, 7 Drawing Sheets

APPARATUS FOR DEPOSITING MONO-MOLECULAR LAYER

BACKGROUND OF THE INVENTION

The present invention generally relates to apparatuses for depositing a mono-molecular layer, and more particularly to an apparatus for depositing a mono-molecular layer on a surface of a substrate by immersion of the substrate into a liquid having the mono-molecular layer at a liquid surface.

Generally, when producing a semiconductor element, processes are required for depositing (coating) various layers on a substrate. For example, a resist coater is used when depositing a resist layer on a wafer. The resist coater rotates the wafer and drops a predetermined quantity of the resist onto the rotating wafer so as to deposit the resist layer on the wafer by use of centrifugal force.

However, when the resist coater is used, there are problems in that pin holes are easily formed in the resist layer and it is difficult to deposit a uniform resist layer on the wafer. These problems become notable at the peripheral portion of the wafer especially when the diameter of the wafer is large. In addition, there is another problem in that the resist is not used efficiently in the resist coater. That is, the quantity of the resist which is actually used to form the resist layer on the wafer is only a few percent of the total quantity of the resist used, and the remaining quantity of the resist is wasted. Furthermore, the rotation of the wafer needs to be controlled depending on the viscosity of the resist, and the control of the wafer is complex.

Accordingly, as another method of depositing layers on the substrate, there is a method of forming a mono-molecular layer (or film) at a liquid surface and depositing the mono-molecular layer on the substrate by immersing the substrate into the liquid. Such a mono-molecular layer is often referred to as a Langmuir Blodgett layer (or film). Depending on the characteristic of the substrate surface, the mono-molecular layer is deposited on the substrate surface either on the first down pass or the first up pass of the substrate through the air/liquid interface.

As will be described later on in the present specification, the conventional apparatus for depositing a resist mono-molecular layer on the substrate comprises an elevator mechanism for raising and lowering the substrate with respect to purified water having the resist mono-molecular layer at the water surface. In the case where the resist mono-molecular layer is to be deposited on both substrate surfaces, the substrate is immersed into the water and then raised with the substrate surfaces approximately perpendicular to the water surface. On the other hand, in the case where the resist mono-molecular layer is to be deposited on only one substrate surface, the substrate is lowered to the water surface with the substrate surface approximately parallel to the water surface, without substantially immerising the substrate into the water.

The mono-molecular layer at the water surface is extremely sensitive to vibration (dynamic force) and will be damaged when subjected to the vibration. However, according to the conventional apparatus, the substrate itself vibrates since it is raised and lowered by the elevator mechanism, and such vibration of the substrate is inevitable. As a result, the vibtration of the substrate acts on the mono-molecular layer as the substrate makes contact with the water surface, and there is a problem in that the mono-molecular layer is easily disturbed and damaged. In addition, since the elevator mechanism is located above the mono-molecular layer, dust particles and the like generated from the elevator mechanism fall on the mono-molecular layer and easily disturb and damage the monom-molecular layer.

On the other hand, in the case where the substrate is lowered to the water surface with the substrate surface approximately parallel to the water surface, without substantially immersing the substrate into the water, it is difficult to control the lowering of the substrate so that the mono-molecular layer will not be disturbed and damaged by the vibration caused by the contact of the substrate and the mono-molecular layer at the water surface.

Furthermore, when forming the mono-molecular layer at the water surface, the conventional apparatus collects the molecules in one direction. But in order to prevent the molecules from being distributed unevenly, that is, to prevent holes and molecule overlap, the molecules must be collected in the one direction with extreme care. Otherwise, the mono-molecular layer at the water surface becomes non-uniform, and it is impossible to deposit a uniform mono-molecular layer on the substrate surface from such a non-uniform mono-molecular layer.

Therefore, the conventional apparatus suffers disadvantages in that the mono-molecular layer cannot be deposited on the substrate surface with a high reliability.

SUMMARY OF THE INVENTION

Accordingly, it is a general object of the present invention to provide a novel and useful apparatus for depositing a mono-molecular layer on a substrate, wherein the problems described heretofore are eliminated.

Another and more specific object of the present invention is to provide an apparatus which comprises first and second containers which contain a liquid and are connected via a connecting passage, and a pressure applying means for applying pressure on the liquid in the second container. A mono-molecular layer is formed at the liquid surface of the liquid in the first container, and the mono-molecular layer is deposited on a substrate surface by controlling the pressure applying means so that the liquid surface of the first container rises and falls with respect to the substrate which is stationary. According to the apparatus of the present invention, the substrate itself will not vibrate because it is stationary, and the liquid surface of the first container will not be disturbed as the liquid surface level changes because the liquid surface of the first container is virtually unaffected by the disturbance in the liquid surface of the second container. As a result, it is possible to prevent the mono-molecular layer from becoming disturbed and damaged at the liquid surface of the first container. In addition, it is possible to prevent dust particles and the like from falling on the mono-molecular layer and damaging the mono-molecular layer because no elevator mechanism is required to move the substrate.

Still another object of the present invention is to provide an apparatus which comprises first and second containers which contain a liquid and are connected via a connecting passage, and a pressure applying means for applying pressure on the liquid in the second container, where the liquid surface area of the first container is greater than that of the second container. A monomolecular layer is formed at the liquid surface of the liquid in the first container, and the mono-molecular layer is deposited on a substrate surface by controlling the pressure applying means so that the liquid surface of the first container rises and falls with respect to the substrate which is supported by spring means. According to the apparatus of the present invention, the substrate itself will not vibrate because it is essentially stationary and is not moved by an elevator mechanism, and the liquid surface of the first container will not be disturbed as the liquid surface level changes because the liquid surface of the first container is virtually unaffected by the disturbance in the liquid surface of the second container especially due to the large liquid surface area of the first container. Furthermore, the spring means prevents excessive immersion of the substrate into the water when the liquid surface makes contact with the subtrate surface which is approximately parallel to the liquid surface. As a result, it is possible to prevent the mono-molecular layer from becoming damaged at the liquid surface of the first container. In addition, it is possible to prevent dust particles and the like from falling on the mono-molecular layer damaging the mono-molecular layer because no elevator mechanism is required to move the substrate.

A further object of the present invention is to provide an apparatus of the types described before in which the liquid surface of the first container is raised and lowered instead of moving the substrate, and which is provided with a flexible loop barrier at the liquid surface of the first container for efficiently collecting the molecules to form the mono-molecular layer at the liquid surface by reducing the size of the flexible loop barrier. According to the apparatus of the present invention, it is possible to form a uniform mono-molecular layer at the liquid surface of the first container, and the reliability with which a uniform mono-molecular layer is deposited on the substrate surface is improved compared to the conventional apparatus. Moreover, when depositing the monomolecular layer a plurality of times to a predetermined layer thickness, the size of the flexible loop barrier can be reduced successively with each deposition.

Other objects and further features of the present invention will be apparent from the following detailed description when read in conjunction with the accompanying drawings.

DETAILED DESCRIPTION

In order to facilitate the understanding of the problems of the conventional apparatuses for depositing (coating) the mono-molecular layer on the substrate surface, description will first be given with respect to examples of the conventional apparatuses.

Figure 1A:
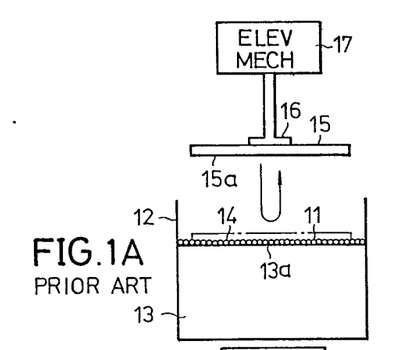
FIGS. 1A and 1B are diagrams for explaining the operation of one example of the conventional apparatus for depositing a mono-molecular layer.
Figure 1B:
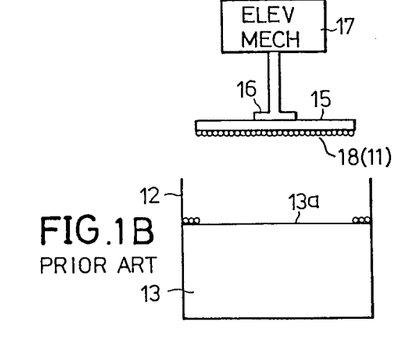

FIGS. 1A and 1B show one example of the conventional apparatus which is designed to deposit a resist mono-molecular layer on one substrate surface by moving a substrate with the substrate surface kept approximately parallel to the liquid surface. A uniform resist mono-molecular layer 11 consisting of resist molecules 14 is formed at a liquid surface 13a of a liquid 13 contained in a container 12. For example, purified water is used as the liquid 13.

Figure 2A:
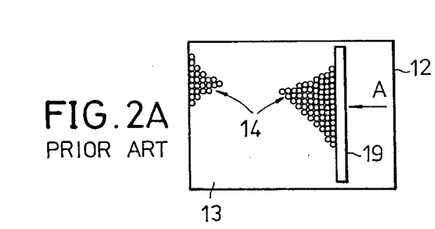
FIGS. 2A and 2B are diagrams for explaining the conventional method of forming a mono-molecular layer at a liquid surface.
Figure 2B:
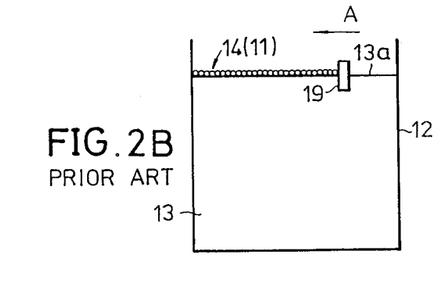

FIGS. 2A and 2B are a top view and a side view in cross section showing a conventional barrier for forming the resist mono-molecular layer 11 at the liquid surface 13a. In FIGS. 2A and 2B, those parts which are the same as those corresponding parts in FIGS. 1A and 1B are designated by the same reference numerals, and description thereof will be omitted. When the resist molecules 14 are distributed on the liquid surface 13a, a barrier 19 moves in a direction A so as to collect the resist molecules 14 and form a uniform resist mono-molecular layer 11 at the liquid surface 13a.

Returning to the description of FIGS. 1A and 1B, a substrate (wafer, for example) 15 is secured on a chuck 16 with a surface 15a thereof facing down to confront the resist mono-molecular layer 11. The chuck 16 is connected to an elevator mechanism 17 which is located above the container 12 and moves the substrate 15 up and down. A resist mono-molecular layer 18 (11) is deposited on the surface 15a of the substrate 15 when the elevator mechanism 17 lowers the substrate 15 so that the surface 15a makes contact with the resist monomolecular layer 11 at the liquid surface 13a, and the substrate 15 is thereafter raised as shown in FIG. 1B.

In FIGS. 1A and 1B and FIGS. 3A and 3B which will be described later, the illustration of the barrier 19 shown in FIGS. 2A and 2B is omitted for convenience' sake.

However, the resist mono-molecular layer 11 is extremely sensitive to vibration (dynamic force) and will be easily damaged by vibration. For this reason, the elevator mechanism 17 must lower the substrate 15 at an extremely slow speed so as not to disturb the liquid surface 13a upon contact therewith. But in actual practice, it is difficult to prevent such a disturbance at the liquid surface 13a. In addition, since the elevator mechanism 17 moves the substrate 15, the vibration of the elevator mechanism 17 is inevitably transmitted to the substrate 15 and the vibration of the substrate 15 itself easily damages the resist mono-molecular layer 11. Furthermore, because the elevator mechanism 17 is located above the container 12, dust particles and the like generated from the elevator mechanism 17 fall on the resist mono-molecular layer 11 and easily damage the resist mono-molecular layer 11.

Figure 3A:
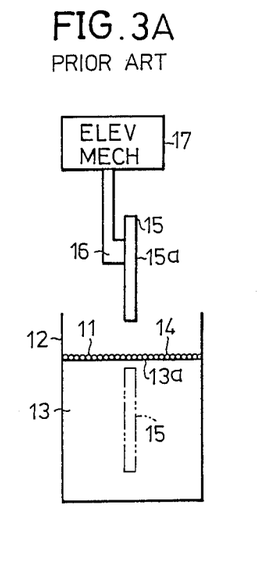
FIGS. 3A and 3B are diagrams for explaining the operation of another example of the conventional apparatus for depositing a mono-molecular layer.
Figure 3B:
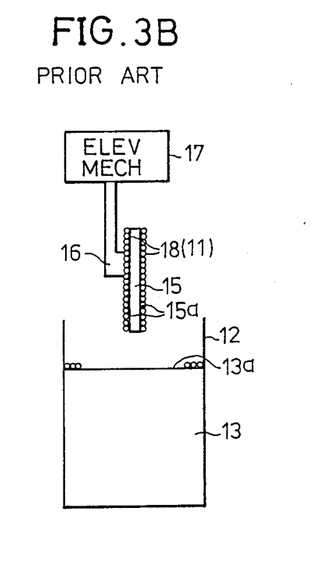

FIGS. 3A and 3B show another example of the conventional apparatus which is designed to deposit a resist mono-molecular layer on substrate surfaces by moving a substrate with the substrate surface kept approximately perpendicular to the liquid surface. In FIGS. 3A and 3B, those parts which are the same as those corresponding parts in FIGS. 1A and 1B are designated by the same reference numerals, and description thereof will be omitted. This apparatus shown in FIGS. 3A and 3B differs from the apparatus shown in FIGS. 1A and 1B only in that the substrate 15 is immersed into the liquid 13 and then taken out of the liquid 13 when depositing the resist mono-molecular layer 18 on the surfaces 15a of the substrate 15.

Figure 4A:
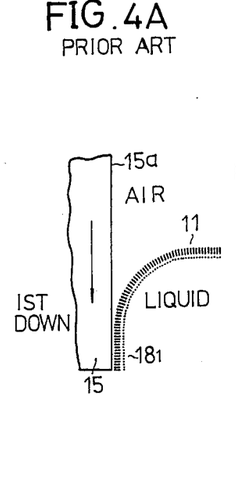
FIGS. 4A through 4C, FIGS. 5A through 5C and FIGS. 6A through 6C are diagrams for explaining the deposition of the mono-molecular layer on a substrate surface.
Figure 4B:
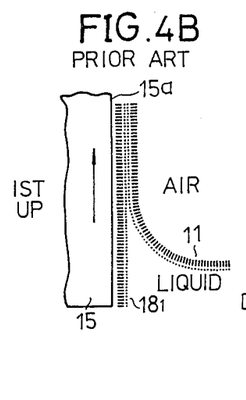
Figure 4C:
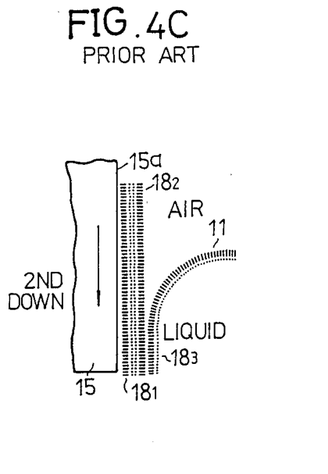
Figure 5A:
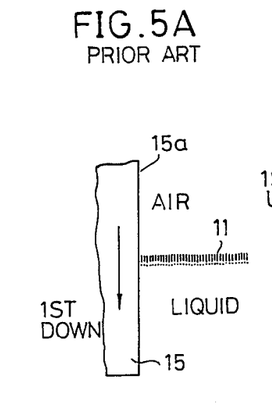
Figure 5B:
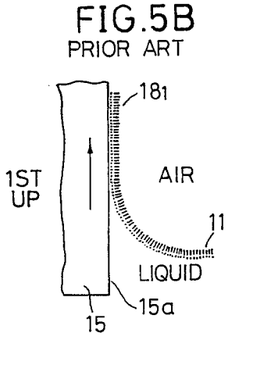
Figure 5C:
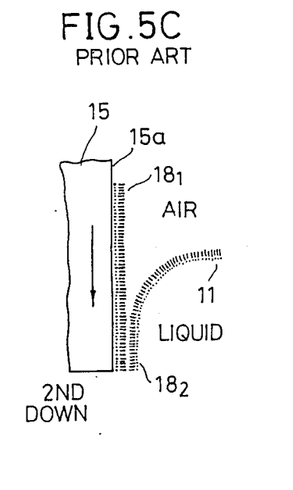

FIGS. 4A through 4C and FIGS. 5A through 5C are diagrams for explaining the deposition of the resist mono-molecular layer 18 on the surface 15a. When the substrate 15 having a suitably treated surface 15a is immersed into the liquid 13, breaking through the resist mono-molecular layer 11, one resist molecular layer is deposited on the surface 15a. Depending on the characteristic of the surface 15a, the first resist molecular layer will adhere either on the first down pass or the first up pass of the substrate 15 through the air/liquid interface. A hydrophobic coating of the surface 15a will result in the deposition of a first resist molecular layer $18_1$ on the first down pass as shown in FIG. 4A since hydrophobic tails adhere to the hydrophobic surface, while no deposition takes place until the first up pass in the case of a hydrophillic coating on the surface 15a as may be seen from FIGS. 5A and 5B. Generally, deposition occurs when the direction of the meniscus formed at boundary between the liquid surface and the substrate surface follows the substrate movement. Once the first resist molecular layer $18_1$ is deposited on the surface 15a, an additional resist molecular layer ($18_2$, $18_3$) is deposited every time the substrate 15 crosses the air/liquid interface as shown in FIGS. 4B, 4C and 5C. As a result, by immersing the substrate 15 into the liquid 13 a predetermined number of times, it is possible to deposit on the surface 15a a resist layer which has a thickness determined by a product of the individual resist molecular length and the number of times the substrate 15 has crossed the air/liquid interface, while it must be kept in mind that no deposition takes place on the first down pass onto a hydrophillic surface.

In the cases shown in FIGS. 4A through 4C and FIGS. 5A through 5C, it is assumed that the resist has such a characteristic that the hydrophobic tails of one resist mono-molecular layer adhere to the hydrophobic tails of an adjacent resist mono-molecular layer, and the hydrophillic heads of one resist mono-molecular layer adhere to the hydrophillic heads of an adjacent resist mono-molecular layer. In these cases, the so-called Y-layer is formed.

Figure 6A:
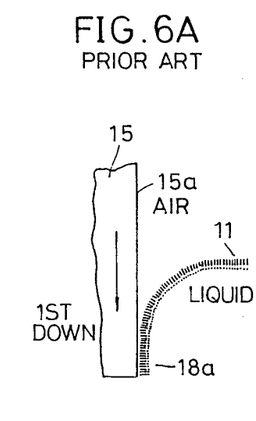
Figure 6B:
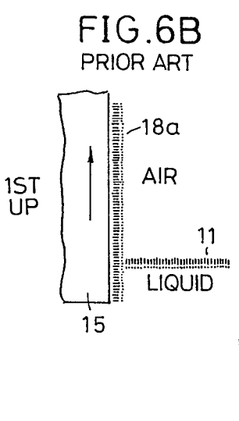
Figure 6C:
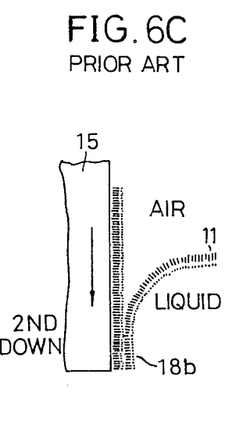

However, depending on the characteristic of the resist (or any other coating material), the hydrophobic tails of one mono-molecular layer only adhere to the hydrophillic heads of an adjacent mono-molecular layer, and vice versa. FIGS. 6A through 6C show such a case. A hydrophobic coating on the surface 15a will result in the deposition of a first mono-molecular layer 18a on the first down pass as shown in FIG. 6A since the hydrophobic tails adhere to the hydrophobic surface. But in this case, no deposition takes place on the first up pass as shown in FIG. 6B since the hydrophillic heads of the mono-molecular layer at the liquid surface do not adhere to the hydrophillic heads of the first mono-molecular layer 18a. On the second down pass, a second mono-molecular layer 18b is deposited on the first mono-molecular layer 18a as shown in FIG. 6C because the hydrophobic tails of the mono-molecular layer at the liquid surface adhere to the hydrophillic heads of the first mono-molecular layer 18a. In this case, the so-called X-layer is formed.

It can thus be seen that in the case of the arrangement shown in FIGS. 1A and 1B, the substrate surface 15a must be hydrophobic. Otherwise, since the hydrophillic heads of the mono-molecular layer 11 at the liquid surface 13a face the liquid 13 and the hydrophobic tails of the mono-molecular layer 11 face the air, no deposition would take place. In the case where the resist (or coating material) has the characteristic described before that forms the Y-layer, only one deposition of the mono-molecular layer is possible according to the arrangement shown in FIGS. 1A and 1B. But in the case where the resist (or coating material) has the characteristic described before that forms the X-layer, successive deposition of the mono-molecular layer is possible even according to the arrangement shown in FIGS. 1A and 1B.

But returning to the conventional apparatus shown in FIGS. 3A and 3B, this apparatus suffers essentially the same problems as the conventional apparatus shown in FIGS. 1A and 1B because the substrate 15 must be moved by the elevator mechanism 17 which causes the vibration and the resist mono-molecular layer 11 at the liquid surface 13a is easily disturbed when the vibrating substrate 15 is immersed into the liquid 13.

The present invention eliminates the problems of the conventional apparatuses described heretofore by keeping the substrate substantially stationary when depositing the mono-molecular layer on the substrate surface, and also provides an improvment in forming a uniform mono-molecular layer at the liquid surface.

Figure 7:
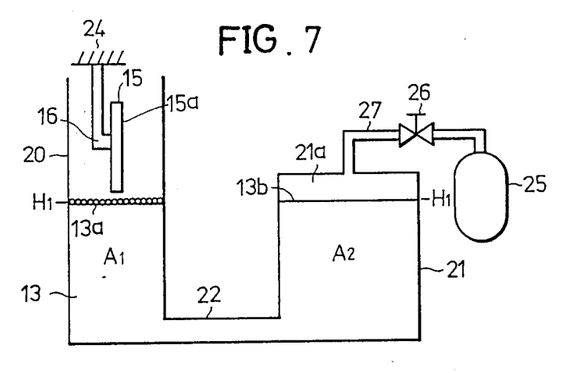
FIG. 7 generally shows a first embodiment of the apparatus according to the present invention for depositing the mono-molecular layer.

FIG. 7 shows the first embodiment of the apparatus according to the present invention. In FIG. 7, those parts which are the same as those corresponding parts in FIGS. 3A and 3B are designated by the same reference numerals, and description thereof will be omitted. The apparatus comprises first and second containers 20 and 21 which are connected to each other via a connecting passage 22. The first and second containers 20 and 21 contain the liquid 13 which is purified water, for example. The liquid surface 13a of the first container 20 and a liquid surface 13b of the second container 21 both have a level H1 because the two containers 20 and 21 are communicated with each other via the connecting passage 22. The resist mono-molecular layer 11 is formed at the liquid surface 13a of the first container.

The substrate 15 is secured on the chuck 16 with the surface 15a approximately perpendicular to the liquid surface 13a. The chuck 16 is fixed to a fixing part 24, and the substrate 15 is kept stationary. In the state shown in FIG. 7, the substrate 15 is inside the first container 20 but is not in contact with the resist mono-molecular layer 11 nor the liquid 13.

A pressure applying means 25 is constituted by a nitrogen gas cylinder, for example. The top of the second container 21 which is hermetically sealed is connected to a pipe arrangement 27 which connects to the pressure applying means 25. A valve 26 is provided at an intermediate part of the pipe arrangement 27.

Next, description will be given with respect to the operation of the apparatus shown in FIG. 7, by referring to FIGS. 8A and 8B. It will be assumed by convenience' sake that the surface 15 a is hydrophillic (refer to FIGS. 5A through 5C). The substrate 15 is secured on the chuck 16 and the resist mono-molecular layer 11 is formed on the liquid surface 13 by use of a barrier (not shown) such as that shown in FIGS. 2A and 2B. Then, pressurized nitrogen gas under a pressure of 8 kg/cm$^2$, for example, is fed into a space 21a in the second container 21 by gradually opening the valve 26, so as to apply pressure on the liquid surface 13b. As a result, the liquid surface 13b falls, and the liquid surface 13a is raised via the connecting passage 22. The resist mono-molecular layer 11 rises together with the liquid surface 13a.

Figure 8A:
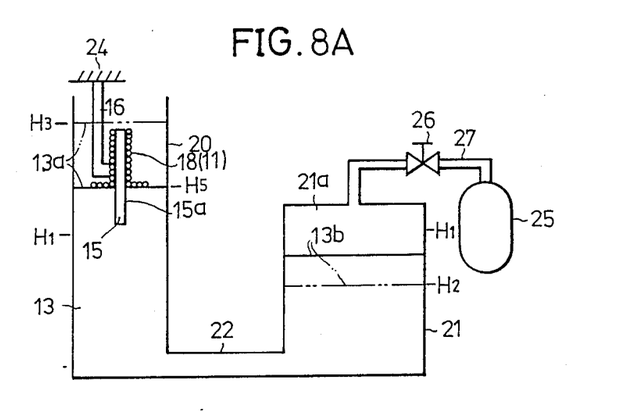
FIGS. 8A and 8B are diagrams for explaining the operation of the apparatus shown in FIG. 7.

As indicated by a two-dot chain line in FIG. 8A, the liquid surface 13b falls to a level H2, and the liquid surface 13a rises to a level H3 which exceeds the highest point on the substrate 15. In other wods, the entire substrate 15 is immersed into the liquid 13 in the first container 20.

Thereafter, the nitrogen gas in the space 21a is gradually released to the atmosphere. Hence, the liquid surface 13b rises and the liquid surface 13a falls, so that the substrate 15 relatively escapes from the liquid 13 in the first container 20. FIG. 8A shows an intermediate state where the liquid surface 13b has a level H4, the liquid surface 13a has a level H5, and the substrate 15 is halfway immersed into the liquid 13 in the first container 20. It will be assumed that the surfaces 15a of the substrate 15 have a hydrophillic coating, and thus, the deposition of the resist mono-molecular layer 18 gradually occurs during the first up pass of the substrate 15 through the air/liquid interface as shown in FIG. 8A.

Figure 8B:
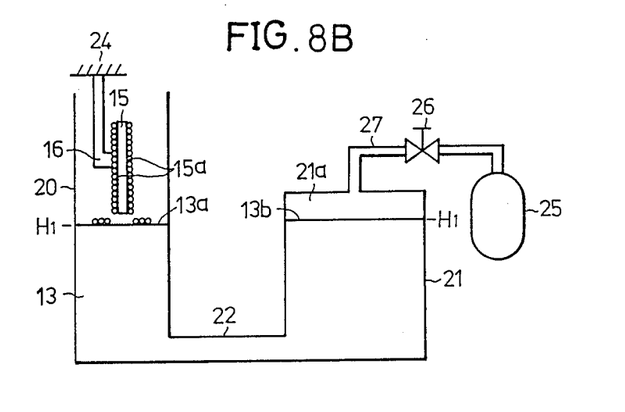

When all of the nitrogen gas in the space 21a is released to the atmosphere, the liquid surfaces 13a and 13b return to the original level H1 as shown in FIG. 8B. Thus, the substrate 15 is completely out of the liquid 13, and the resist mono-molecular layer 18 is deposited on the surfaces 15a of the substrate 15. The operation of supplying the nitrogen gas into the space 21a and releasing the nitrogen gas in the space 21a to the atmosphere may be carried out again when an additional resist mono-molecular layer is to be formed on the first resist mono-molecular layer 18. A resist layer of a desired thickness may be deposited on the surfaces 15a by repeating such operations.

According to the present embodiment, the substrate 15 is prevented from vibrating because the substrate 15 is kept stationary, and consequently, there is no possibility of the resist mono-molecular layer 11 at the liquid surface 13a being disturbed by such vibration of the substrate 15. In addition, no elevator mechanism is required to raise and lower the substrate 15. Further, since no elevator mechanism is used, it is possible to prevent the resist mono-molecular layer 11 from being disturbed and damaged by the dust particles and the like generated from the elevator mechanism. Therefore, a uniform resist mono-molecular layer 18 can be deposited on the surfaces 15a with a high reliability.

On the other hand, because the vibration of the substrate 15, that is, the cause of the disturbance in the resist mono-molecular layer 11, is eliminated, the liquiud surface 13a may be raised and lowered at a speed faster than the speed with which the substrate 15 is raised and lowered by the elevator mechanism of the conventional apparatus. Accordingly, the time required to deposit the resist mono-molecular layer 18 on the surfaces 15a is shortened compared to the time required in the conventional apparatus. The moving speed of the liquid surface 13a may be satisfactorily controlled by appropriately selecting a ratio of a horizontal cross sectional area (that is, the liquid surface area) A1 of the first container 20 and a horizontal cross sectional area (that is, the liquid surface area) A2 of the second container 21.

Figure 9:
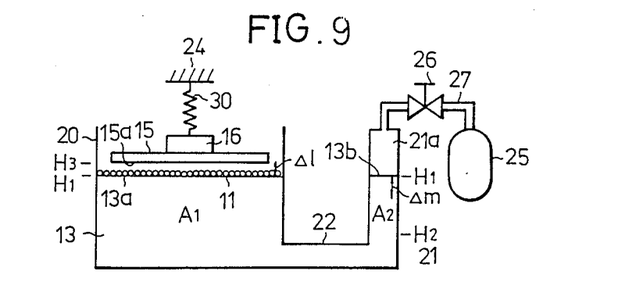
FIG. 9 generally shows a second embodiment of the apparatus according to the present invention for depositing the mono-molecular layer.

FIG. 9 shows the second embodiment of the apparatus according to the present invention. In FIG. 9, those parts which are the same as those corresponding parts in FIG. 7 are designated by the same reference numerals, and description thereof will be omitted. The cross sectional area A1 of the first container 20 is set to a value greater than the cross sectional area A2 of the second container 21. In addition, the substrate 15 is secured on the chuck 16 which is connected to the fixed part 24 via a spring means 30. Hence, the substrate 15 hangs from the fixed part 24 with the surface 15a approximately parallel to the liquid surface 13a.

Next, description will be given with respect to the operation of the apparatus shown in FIG. 9 by referring to FIGS. 10A and 10B. It will be assumed that the surface 15a is hydrophobic. A ratio $\Delta l/\Delta m$ between a displacement $\Delta l$ of the liquid surface 13a and a displacement $\Delta m$ of the liquid surface 13b corresponds to the ratio A2/A1. Since A1>A2, the ratio $\Delta l/\Delta m$ is less than 1.0. The ratio $\Delta l/\Delta m$ is approximately 1/6 in the present embodiment. For this reason, the liquid surface 13a rises at an extremely slow speed without disturbing and damaging the resist mono-molecular layer 11 at the liquid surface 13a.

Figure 10A:
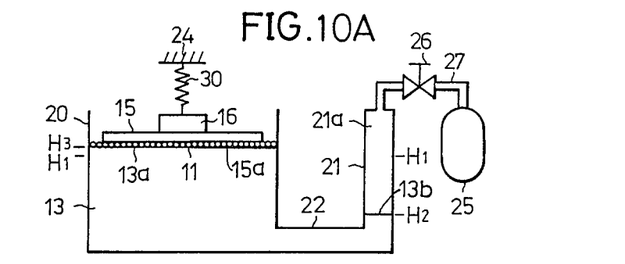
FIGS. 10A and 10B are diagrams for explaining the operation of the apparatus shown in FIG. 9.
Figure 10B:
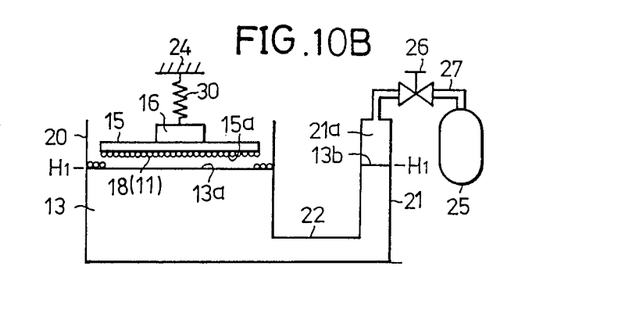

When the nitrogen gas is supplied into the space 21a and the liquid surface 13b falls to the level H2, the liquid surface 13a rises to the level H3, and the resist mono-molecular layer 11 makes contact with and is deposited on the surface 15a of the substrate 15 as shown in FIG. 10A. Since the area of the substrate 15 first making contact with the resist mono-molecular layer 11 is large compared to the first embodiment described before due to the horizontal arrangement of the substrate 15, the resist mono-molecular layer 11 may be disturbed upon contact even though the liquid surface 13a rises at the extremely slow speed. For this reason, the substrate 15 in the present embodiment is provided in a hanging manner by the spring means 30. By the provision of the spring means 30, the substrate 15 floats on the liquid surface 13a (or the resist mono-molecular layer 11) and rises with the liquid surface 13a, absorbing the shock upon contact. Hence, it is possible to prevent the substrate 15 from being excessively immersed into the liquid 13, and the shock upon contact is effectively absorbed so as to prevent disturbance and possible damage in the resist mono-molecular layer 11.

Thereafter, the nitrogen gas in the space 21a is gradually released to the atmosphere. As a result, the liquid surface 13a falls to the original level H1 at the extremely slow speed, leaving the deposited resist mono-molecular layer 18 on the surface 15a of the substrate 15 as shown in FIG. 10B.

As in the case of the first embodiment, the operation of supplying the nitrogen gas into the space 21a and releasing the nitrogen gas in the space 21a to the atmosphere may be repeated so as to deposit a resist layer of a desired thickness on the surface 15a.

According to the present invention, the vibration caused by the elevator mechanism is eliminated because the substrate 15 is kept substantially stationary and no elevator mechanism is required to raise and lower the substrate 15. Further, since no elevator mechanism is used, it is possible to prevent the resist mono-molecular layer 11 from being disturbed and damaged by the dust particles and the like generated from the elevator mechanism. Therefore, a uniform resist mono-molecular layer 18 can be deposited on the surface 15a with a high reliability. On the other hand, by the provision of the spring means 30 which supports the substrate 15 in the hanging manner, the shock upon contact of the surface 15a of the substrate 15 and the rising liquid surface 13a (that is, the resist mono-molecular layer 11) can be effectively reduced especially when the substrate 15 is arranged with the surface 15a arranged approximately parallel to the liquid surface 13a and the contact area is relatively large.

Figure 11A:
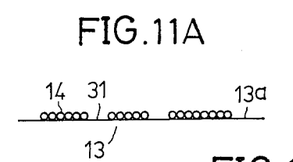
FIGS. 11A through 11C are diagrams for explaining the formation of the mono-molecular layer at the liquid surface.
Figure 11B:
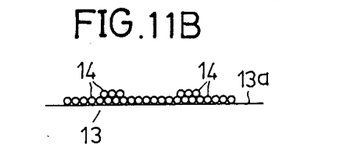

In the first and second embodiments described heretofore, it is assumed that the resist mono-molecular layer 11 is formed at the liquid surface 13a by use of the barrier such as that shown in FIGS. 2A and 2B. However, the barrier 19 shown in FIGS. 2A and 2B collect the resist molecules 14 in one direction, namely the direction A. For this reason, the displacement of the barrier 19 and the resist layer portions or molecules are generally in the same direction A, and the barrier 19 must be moved with extreme care so as not to leave holes 31 in the resist mono-molecular layer 11 as shown in FIG. 11A due to insufficient collection of the resist molecules nor generate resist molecule overlap as shown in FIG. 11B due to over-collection of the resist molecules. In other words, the formation of the resist mono-molecular layer 11 at the liquid surface 13a is extremely difficult to control.

Figure 12:
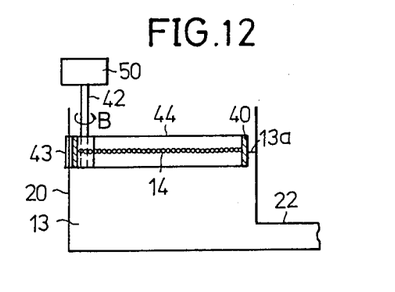
FIG. 12 shows a modification of the first and second embodiments of the apparatus according to the present invention.

FIG. 12 shows a modification of the first and second embodiments. In FIG. 12, those parts which are the same as those corresponding parts in FIGS. 7 and 9 are designated by the same reference numerals, and description thereof will be omitted. The illustration of the substrate 15 and the second container 21 is omitted for convenience' sake. A flexible loop barrier shown in FIG. 13 constitutes an essential part of this modification.

Figure 13:
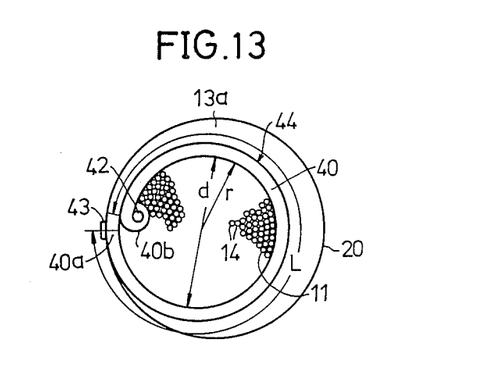
FIG. 13 is a top view showing an embodiment of a flexible loop barrier which constitutes an essential part of the modification shown in FIG. 12.

In FIG. 13, a flexible loop barrier 44 comprises a resilient belt-shaped member 40 which is bent in the form of a ring. For example, the surface of the member 40 is made of Teflon (registerd trademark) so that the resist molecules 14 will not easily adhere to the member 40. One end 40a of the member 40 is fixed to a portion of the inner peripheral wall of the first container 20 by a fixing part 43, and another end 40b of the member 40 is wound around a vertical shaft 42 in a vicinity of the one end 40a. Hence, the size of the loop barrier 44 may be changed by rotating the vertical shaft 42 or by moving the vertical shaft 42 along the inner peripheral wall of the first container 20 by use of a driving means 50 shown in FIG. 12. The member 40 is immersed into the liquid 13 as shown in FIG. 12 so that approximately the lower half of the member 40 along the width thereof is in the liquid 13 and approximately the upper half of the member 40 along the width thereof is above the liquid surface 13a.

The resist molecules 14 are distributed on the liquid surface 14 inside the loop barrier 44, and the vertical shaft 42 is rotated in a direction B by the driving means 50 while measuring the layer stress of the resist mono-molecular layer 11 by use of a measuring apparatus (not shown), so as to reduce the size of the loop barrier 44. When the vertical shaft 42 is rotated in the direction B, the member 40 is taken up from the other end 40b, and a diameter d of the loop barrier 44 gradually decreases while maintaining the loop shape. As a result, the resist molecules 14 are collected towards the center of the loop barrier 44 and the resist mono-molecular layer 11 is formed at the liquid surface 13a inside the loop barrier 44.

Figure 11C:
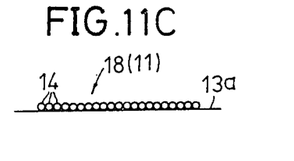

When a total length L of the member 40 is shortened by a length $\Delta L$ by rotating the vertical shaft 42, a radius r of the loop barrier 44 is reduced by a length $\Delta r$ and the size of the loop barrier 44 is reduced. The lengths $\Delta L$ and $\Delta r$ satisfy the equation $\Delta r = \Delta L/2\pi$, and the change in the radius r is reduced to $\frac{1}{2}\pi$ the change in the length L. For this reason, the diameter d of the loop barrier 44 changes extremely slowly as the vertical shaft 42 is rotated while measuring the layer stress of the resist mono-molecular layer 11, and the distributed resist molecules 14 are uniformly collected towards the center of the loop barrier 44 under extremely fine control. Therefore, a uniform resist mono-molecular layer 11 shown in FIG. 11C can be formed at the liquid surface 13a by finely controlling the diameter d, without generating holes or molecule overlap shown in FIGS. 11A and 11B.

The diameter d and shape of the loop barrier 44 returns back to the original diameter and shape due to the flexibility thereof when the taking-up force acting on the vertical shaft 42 is released.

In FIG. 12, the diameter d of the loop barrier 44 may be reduced appropriately when level of the liquid surface 13a changes and the substrate 15 is relatively immersed into and taken out of the liquid 13, depending on the deposition of the resist mono-molecular layer 18 on the surfaces 15a of the substrate 15, in the case where the substrate 15 is arranged vertically so that the surfaces 15a are approximately perpendicular to the liquid surface 13a. The deposition of the resist mono-molecular layer 18 on the surfaces 15a can be carried out repeatedly to a predetermined layer thickness by successively reducing the diameter d without the need to add resist molecules 14 with every deposition, provided that the cross sectional area A1 of the first container 20 and the diameter d are sufficiently large.

The repetitive deposition of the resist mono-molecular layer 18 on the surface 15a of the substrate 15 which is arranged horizontally so that the surface 15a is approximately parallel to the liquid surface 13a may be carried out similarly by successively and appropriately reducing the diameter d of the loop barrier 44 in FIG. 12.

In the embodiments and modification described heretofore, a resist mono-molecular layer is deposited on a substrate surface. However, the mono-molecular layer deposited on the substrate surface by the apparatus of the present invention is not limited to the resist mono-molecular layer, and other inorganic and organic mono-molecular layers may be deposited in the same manner. For example, an organic mono-molecular layer such as a vinyl stearate mono-molecular layer and a diacetylene derivative mono-molecular layer may be deposited on the substrate surface by the apparatus of the present invention. It is also possible to deposit a semiconducting mono-molecular layer and an insulating mono-molecular layer by the apparatus of the present invention. In addition, the liquid used to form the mono-molecular layer at the liquid surface thereof is of course not limited to purified water, and any liquid may be used as long as the molecules constituting the mono-molecular layer which is to be deposited are insoluble to the liquid and the mono-molecular layer can be formed satisfactorily at the liquid surface.

Further, the present invention is not limited to these embodiments and various variations and modifications may be made without departing from the scope of the present invention.

What is claimed is:

1. An apparatus for depositing a mono-molecular layer on a surface of a substrate, said apparatus comprising:

a first container;
   a second container which is hermetically sealed, said first and second containers containing a liquid wherein said first container has a first horizontal cross sectional area greater than a second horizontal cross sectional area of said second container, such that a liquid surface area of said first container is greater than a liquid surface area of said second container;
   a connecting passage connecting said first and second containers;
   pressure control means for controlling a pressure applied on a liquid surface of said second container;
   means for forming a mono-molecular layer at a liquid surface of said first container; and
   support means for supporting a substrate stationary above the liquid surface of said first container,
   said pressure control means raising and lowering said mono-molecular layer together with the liquid surface of said first container via said connecting passage so that said mono-molecular layer is deposited on at least one surface of said substrate by making said substrate contact said mono-molecular layer.

2. An apparatus as claimed in claim 1 in which said means for forming said mono-molecular layer at the liquid surface of said first container comprises a flexible loop barrier located at the liquid surface of said first container for collecting molecules which are to form said mono-molecular layer, said mono-molecular layer being formed at the liquid surface of said first container by reducing a loop diameter of said flexible loop barrier.

3. An apparatus as claimed in claim 2 in which said flexible loop barrier comprises a resilient belt-shaped member having one end thereof fixed to an inner wall of said first container and having another end thereof connected to driving means, said flexible belt-shaped member extending approximately parallel to the liquid surface and being bent in the form of a loop which has a loop diameter controlled by said driving means which moves the other end of said resilient belt shaped member.

4. An apparatus as claimed in claim 2 in which said pressure control means includes means for raising and lowering said mono-molecular layer together with the liquid surface of said first container a plurality of times so that said mono-molecular layer is deposited a plurality of times to a predetermined layer thickness, and means for successively reducing the loop diameter of said flexible loop barrier responsive to each deposition.

5. An apparatus as claimed in claim 1 in which said support means supports said substrate so that the surface of the substrate is approximately perpendicular to the liquid surface of said first container, said substrate being immersed into the liquid in its entirety when said mono-molecular layer at the liquid surface of the first container is raised by said pressure control means.

6. An apparatus as claimed in claim 1 in which said support means supports said substrate so that the surface of the substrate is approximately parallel to the liquid surface of said first container, said surface of said substrate making contact with said mono-molecular layer at the liquid surface of the first container when said mono-molecular layer is raised by said pressure control means.

7. An apparatus for depositing a mono-molecular layer on a surface of a substrate, said apparatus comprising:

a first container having a first horizontal cross sectional area;
   a second container which is hermetically sealed and has a second horizontal cross sectional area smaller than said first horizontal cross sectional area, said first and second containers containing a liquid thereby a liquid surface area of said first container being greater than a liquid surface area of said second container;
   a connecting passage connecting said first and second containers;
   pressure control means for controlling a pressure applied on the liquid surface of said second container;
   means for forming a mono-molecular layer at the liquid surface of said first container; and
   spring means for supporting a substrate in a hanging manner above the liquid surface of said first container so that a surface of said substrate is approximately parallel to the liquid surface of said first container,
   said pressure control means raising and lowering said mono-molecular layer together with the liquid surface of said first container via said connecting passage so that said mono-molecular layer is deposited on the surface of said subtrate by making said substrate contact said mono-molecular layer,
   said spring means absorbing contact shock when said substrate makes contact with said mono-molecular layer at the liquid surface of said first container.

8. An apparatus as claimed in claim 7 in which said means for forming said mono-molecular layer at the liquid surface of said first container comprises a flexible loop barrier located at the liquid surface of said first container for collecting molecules which are to form said mono-molecular layer, said mono-molecular layer being formed at the liquid surface of said first container by reducing a loop diameter of said flexible loop barrier.

9. An apparatus as claimed in claim 8 in which said flexible loop barrier comprises a resilient belt-shaped member having one end thereof fixed to an inner wall of said first container and having another end thereof connected to driving means, said flexible belt-shaped member extending approximately parallel to the liquid surface and being bent in the form of a loop which has a loop diameter controlled by said driving means which moves the other end of said resilient belt shaped member.

10. An apparatus as claimed in claim 8 in which said pressure control means includes means for raising and lowering said mono-molecular layer together with the liquid surface of said first container a plurality of times so that said mono-molecular layer is deposited a plurality of times to a predetermined layer thickness, and means for successively reducing the loop diameter of said flexible loop barrier responsive to each deposition.

* * * * *